(12) United States Patent
Henson et al.

(10) Patent No.: US 9,653,597 B2
(45) Date of Patent: May 16, 2017

(54) METHOD FOR FABRICATING A SHALLOW AND NARROW TRENCH FET AND RELATED STRUCTURES

(75) Inventors: Timothy D. Henson, Torrance, CA (US); Ling Ma, Redondo Beach, CA (US); Hugo Burke, Llantrisant (GB); David P. Jones, South Glamorgan (GB); Kapil Kelkar, Torrance, CA (US); Niraj Ranjan, El Segundo, CA (US); Igor Bol, Topanga, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 12/800,662

(22) Filed: May 20, 2010

(65) Prior Publication Data

US 2011/0284950 A1    Nov. 24, 2011

(51) Int. Cl.
*H01L 29/78*     (2006.01)
*H01L 29/08*     (2006.01)
*H01L 29/66*     (2006.01)

(52) U.S. Cl.
CPC ...... *H01L 29/7813* (2013.01); *H01L 29/0878* (2013.01); *H01L 29/66734* (2013.01)

(58) Field of Classification Search
CPC .................................................. H01L 29/7813
See application file for complete search history.

(56) References Cited

U.S. PATENT DOCUMENTS

| | | |
|---|---|---|
| 6,603,173 B1 | 8/2003 | Okabe |
| 6,919,599 B2 | 7/2005 | Henson |
| 7,271,068 B2 | 9/2007 | Kubo |
| 7,605,425 B2 | 10/2009 | Bhalla |
| 7,745,289 B2 * | 6/2010 | Bencuya ............ H01L 29/7813 257/328 |
| 2004/0021174 A1 | 2/2004 | Kobayashi |
| 2005/0029584 A1 | 2/2005 | Shiraishi |
| 2005/0224891 A1 | 10/2005 | Xu |
| 2006/0180855 A1 | 8/2006 | Bhalla |
| 2007/0018243 A1 | 1/2007 | Ono |

(Continued)

FOREIGN PATENT DOCUMENTS

| | | |
|---|---|---|
| CN | 101107718 | 1/2008 |
| EP | 1 536 480 | 6/2005 |

(Continued)

*Primary Examiner* — Yu-Hsi D Sun
(74) *Attorney, Agent, or Firm* — Murphy, Bilak & Homiller, PLLC

(57) ABSTRACT

Disclosed is a method for fabricating a shallow and narrow trench field-effect transistor (trench FET). The method includes forming a trench within a semiconductor substrate of a first conductivity type, the trench including sidewalls and a bottom portion. The method further includes forming a substantially uniform gate dielectric in the trench, and forming a gate electrode within said trench and over said gate dielectric. The method also includes doping the semiconductor substrate to form a channel region of a second conductivity type after forming the trench. In one embodiment, the doping step is performed after forming the gate dielectric and after forming the gate electrode. In another embodiment, the doping step is performed after forming the gate dielectric, but prior to forming the gate electrode. Structures formed by the invention's method are also disclosed.

5 Claims, 4 Drawing Sheets

(56) References Cited

U.S. PATENT DOCUMENTS

| | | | |
|---|---|---|---|
| 2007/0120194 A1 | 5/2007 | Shiraishi | |
| 2008/0070365 A1* | 3/2008 | Park | 438/270 |
| 2008/0283909 A1 | 11/2008 | Akiyama | |
| 2009/0212358 A1 | 8/2009 | Shiraishi | |
| 2009/0315104 A1* | 12/2009 | Hsieh | 257/330 |

FOREIGN PATENT DOCUMENTS

| | | |
|---|---|---|
| JP | H 6-224437 | 8/1994 |
| JP | H 7-263692 | 10/1995 |
| JP | H11111983 A | 4/1999 |
| JP | 2001-102576 | 4/2001 |
| JP | 2002368220 A | 12/2002 |
| JP | 2005-191359 | 7/2005 |
| JP | 2007531988 A | 11/2007 |
| JP | 2008-530800 | 8/2008 |
| JP | 2009176953 A | 8/2009 |
| WO | WO 2006/086636 | 8/2006 |

\* cited by examiner

METHOD FOR FABRICATING A SHALLOW AND NARROW TRENCH FET AND RELATED STRUCTURES

BACKGROUND OF THE INVENTION

1. Field of the Invention

The present invention is generally in the field of semiconductors. More specifically, the present invention is in the field of fabrication of transistors.

2. Background Art

Power semiconductor devices, such as field-effect transistors (FETs) are widely used in a variety of electronic devices and systems. Examples of such electronic devices and systems are power converters, such as DC to DC converters, in which vertically conducting trench type silicon FETs, for instance, may be implemented as power switches. In power converters, power losses within the power switches, as well as factors affecting switching speed, are becoming increasingly important. For example, for optimal performance it is desirable to reduce overall gate charge Qg, gate resistance Rg, and ON-resistance $R_{dson}$ of the power switches.

Optimizing $R_{dson}$ in a vertical trench FET, for example, may require carefully controlling the length of the channel. That is to say, implementation of a vertical trench FET having a short channel may improve the $R_{dson}$ characteristic of the device. However, conventional methods of forming vertical trench FETs can undesirably affect channel length rendering a short channel unachievable and the channel length uncontrollable. For example, conventional methods can expose dopants, used to form the channel, to high temperature processes, thereby uncontrollably increasing channel length. Moreover, the conventional vertical trench FET requires deep trenches to, for example, counter the lack of control over the channel length.

Thus, there is a need for a method that can provide trench FETs while overcoming the drawbacks and deficiencies in the art.

SUMMARY OF THE INVENTION

A method for fabricating a shallow and narrow trench field-effect transistor (trench FET) and related structures, substantially as shown in and/or described in connection with at least one of the figures, as set forth more completely in the claims.

DETAILED DESCRIPTION OF THE INVENTION

Figure 1:
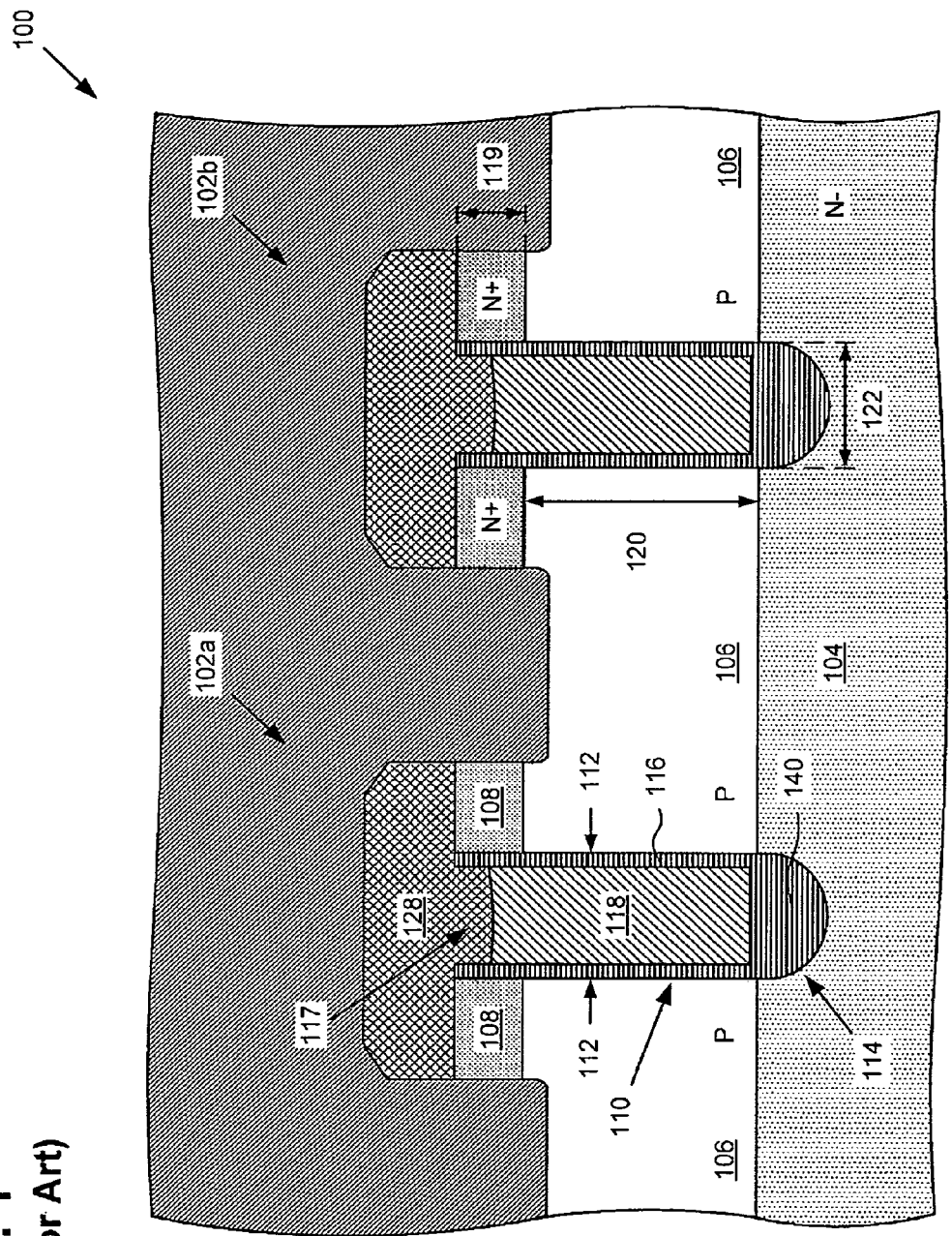
FIG. 1 is a cross-sectional view showing trench field-effect transistors fabricated using a conventional method of fabrication.

The present invention is directed to a method for fabricating a shallow and narrow trench field-effect transistor (trench FET) and related structures. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of a semiconductor device including conventional trench field-effect transistors (FETs). As shown in FIG. 1, semiconductor device 100 includes transistors 102a and 102b, which are implemented, for example, in silicon and which are vertical trench type transistors. In the present example, in semiconductor device 100, transistors 102a and 102b correspond to one another and include similar elements and dimensions, and are generally identical, and may comprise multiple fingers or segments of the same transistor.

As shown in FIG. 1, transistor 102a includes drift region 104, channel regions 106, and source regions 108. As shown in FIG. 1, channel regions 106 are formed over drift region 104 and source regions 108 are formed over channel regions 106. In the present example, drift region 104 comprises N type semiconductor material, channel regions 106 comprise P type semiconductor material, and source regions 108 comprise N type semiconductor material. Thus, in the present example, transistor 102a is an N type trench FET.

Also shown in FIG. 1, transistor 102a has trench 110 including sidewalls 112 and bottom portion 114. Trench 110 is situated between source regions 108 and channel regions 106. Furthermore, in the present example, trench 110 extends from a top surface of source regions 108 and into drift region 104, such that bottom portion 114 of trench 110 is in drift region 104.

As shown in FIG. 1, trench 110 also includes gate dielectric 116 and gate electrode 118 formed therein. Gate dielectric 116 includes portions lining respective sidewalls 112 of trench 110 and thick bottom oxide 140 formed over bottom portion 114 of trench 110. Gate electrode 118 is formed over thick bottom oxide 140 of gate dielectric 116. Thick bottom oxide 140 of gate dielectric 116 can reduce gate to drain charge $Q_{gd}$ in semiconductor device 100. As shown in FIG. 1, in the present example, gate electrode 118 is recessed from the top surface of trench 110 and the top surfaces of source regions 108, thereby forming recess 117. Dielectric material 128 is formed over source regions 108 and fills recess 117.

As stated above, in the present example, transistors 102a and 102b have similar dimensions. Thus, as shown in FIG. 1, transistor 102a has trench width 122, source depth 119, and channel length 120. In transistor 102a, trench sidewalls 112 are substantially parallel, thus, trench 110 has a uniform trench width 122, which by way of a specific example, can be approximately 0.5 to 0.6 microns. Also, as one example, in transistor 102a, source depth 119 can be approximately 0.3 to 0.35 microns and channel length 120 can be approximately 0.7 microns. Thus, transistor 102a has a relatively long to channel length, which is accommodated by a relatively deep trench 110. For example, trench 110 can be approximately 1.2 microns long.

The formation of semiconductor device 100 is subject to significant constraints, which can degrade device performance and characteristics. For example, in forming transistor 102a, source depth 119 and channel length 120 are subject to significant constraints, which prevent formation of a short channel device. Thus, reduction of $R_{dson}$ is significantly limited in semiconductor device 100.

In forming transistor 102a, a semiconductor substrate is doped with, for example, P type dopants, to form channel regions 106. N type source regions 108 can be formed before or after formation of the transistor gate. When trench 110, gate dielectric 116, and gate electrode 118 are formed in the semiconductor substrate, the semiconductor substrate is exposed to significant temperatures, which can undesirably drive the dopants and can render channel length 120 uncontrollable in semiconductor device 100. For example, channel length 120 (and source depth 119, if source regions 108 are formed prior to gate formation) can be driven to an undesirable depth, preventing a relatively short channel length 120 and requiring a deep trench 110.

Forming a gate dielectric can comprise a high temperature process. Furthermore, including a thick bottom oxide, for example thick bottom oxide 140, requires additional processing steps, which can increase exposure of dopants to high temperatures. Thus, because gate dielectric 116 includes thick bottom oxide 140, the semiconductor substrate can be exposed to additional high temperatures, further increasing channel length 120 in semiconductor device 100, thereby hindering formation of a short channel length 120 and a shallow trench 110. Forming thick bottom oxide 140 can further complicate formation of semiconductor device 100, for example, by requiring additional processing steps and increasing manufacturing costs.

Forming transistor 102a with recess 117 can also introduce significant constraints in forming semiconductor device 100. In transistor 102a, recess 117 prevents shorting between gate electrode 118 and source regions 108 and can have a depth of approximately 0.15 microns. The depth of recess 117 can be difficult to control in formation of semiconductor device 100. Thus, reducing source depth 119, introduces considerable risk of gate electrode 118 falling below source regions 108, which would significantly degrade device performance. As such, source depth 119 cannot be significantly reduced in order to prevent gate electrode 118 from falling below source regions 108, thereby hindering formation of a short channel length 120 and a shallow trench 110.

The present invention provides a trench field-effect transistor (trench FET) and a method for fabricating the same. The method can be used to form a shallow and narrow trench FET having improved device performance characteristics, such as $R_{dson}$, not achievable in conventional semiconductor devices, by reducing or eliminating significant constraints imposed by conventional methods.

Figure 2:
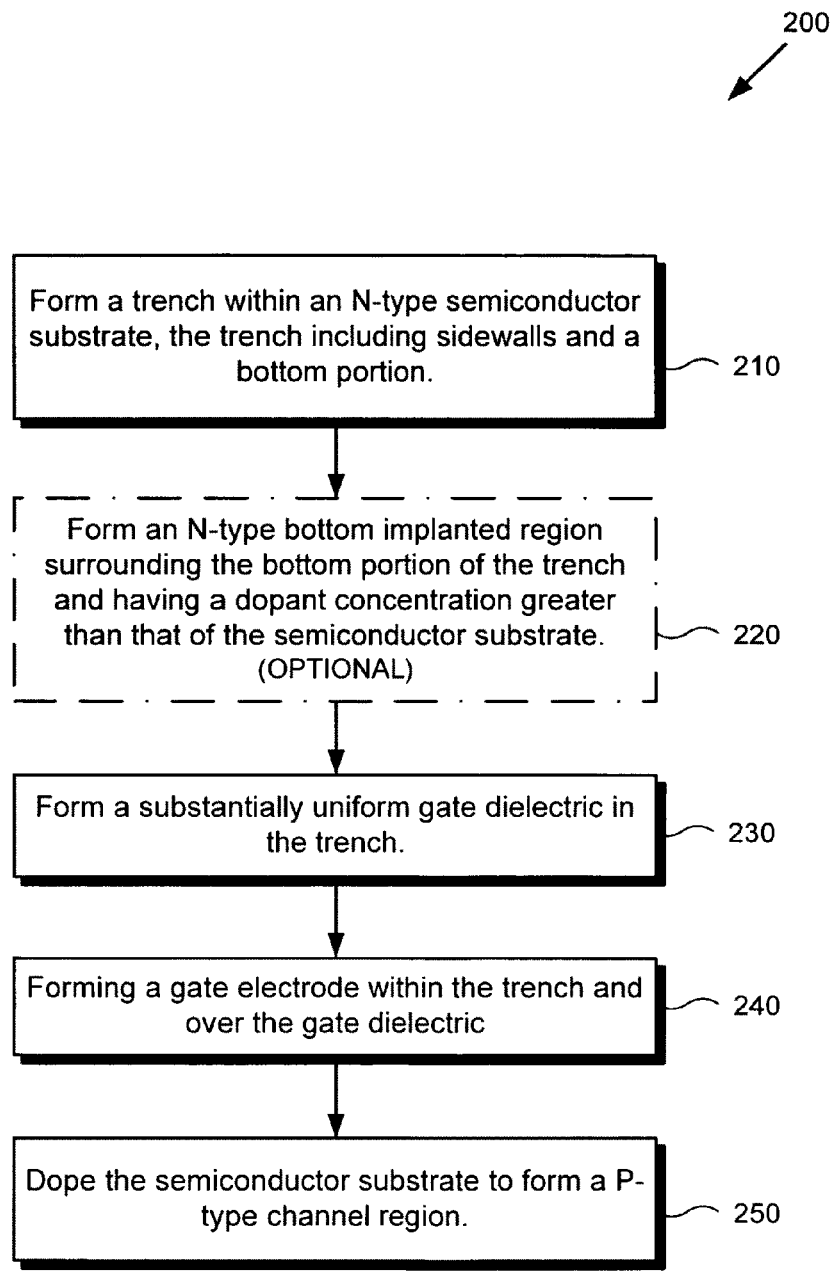
FIG. 2 is a flowchart presenting a method for fabricating shallow and narrow trench field-effect transistors, according to one embodiment of the present invention.
Figure 3:
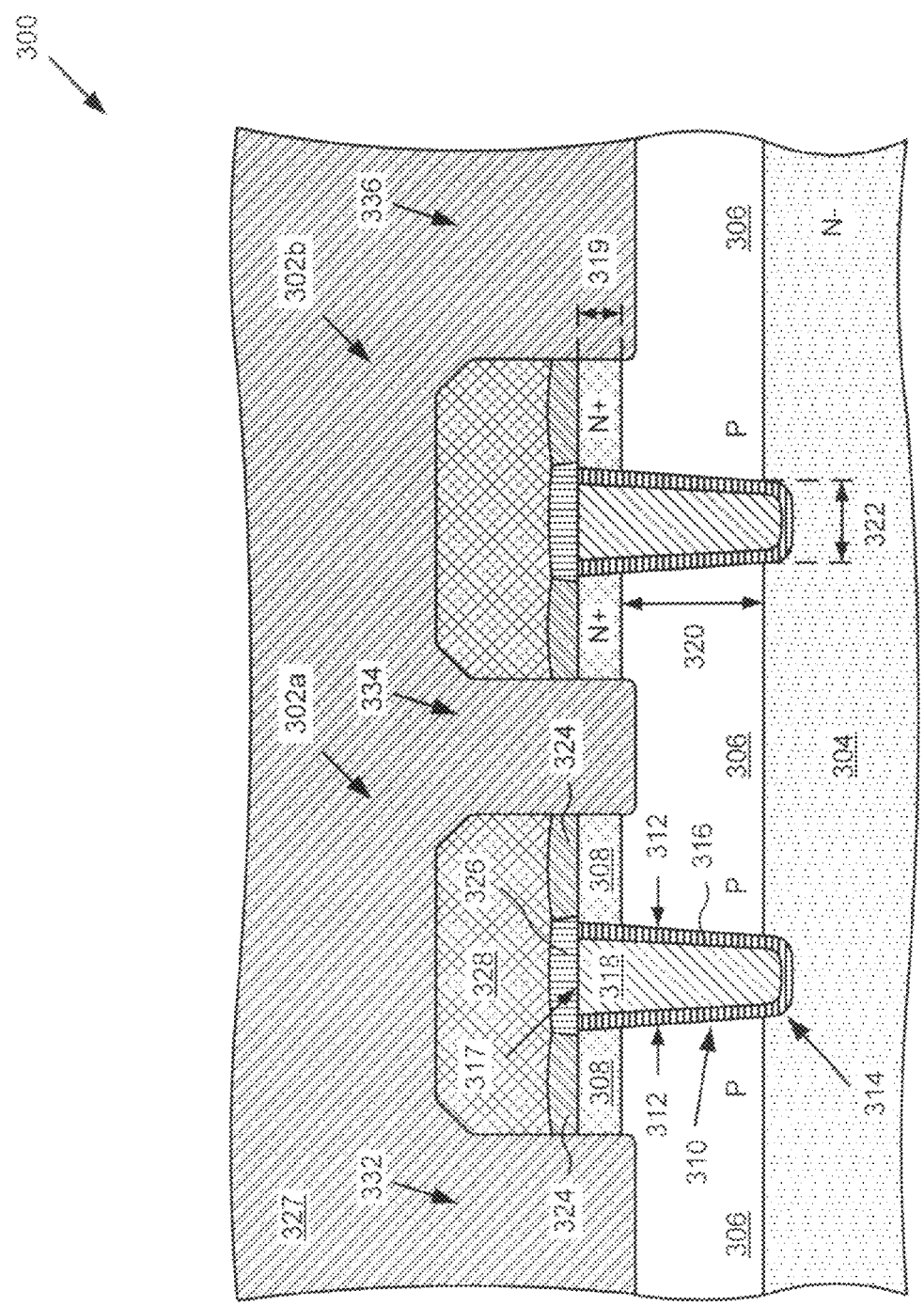
FIG. 3 is a cross-sectional view showing shallow and narrow trench field-effect transistors fabricated according to one embodiment of the present invention.
Figure 4:
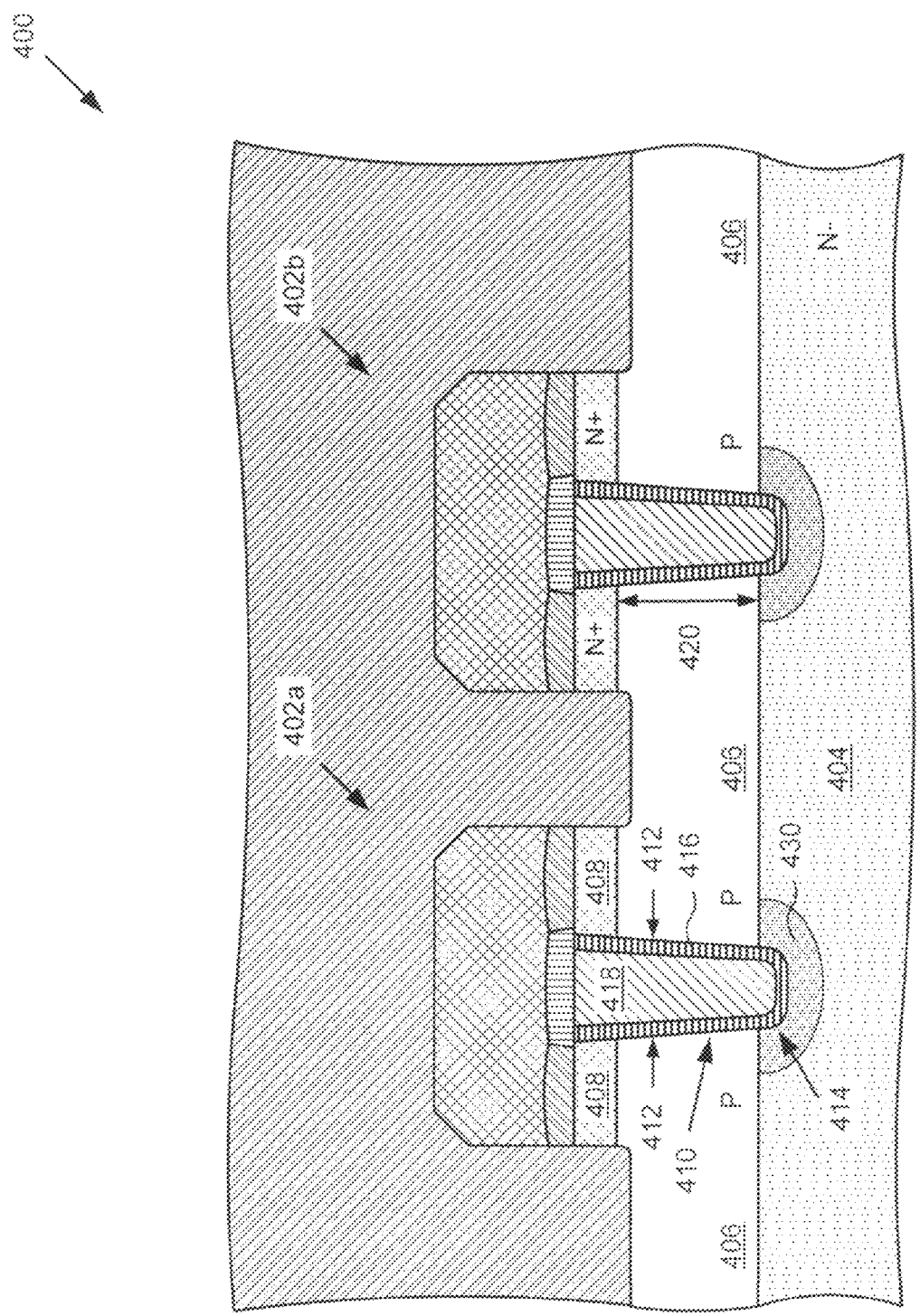
FIG. 4 is a cross-sectional view showing shallow and narrow trench field-effect transistors fabricated according to one embodiment of the present invention.

FIG. 2 presents flowchart 200 describing exemplary embodiments of a method for fabricating shallow and narrow trench FETs, for example, trench FETs 302a and 302b in FIG. 3 and trench FETs 402a and 402b in FIG. 4. It will be appreciated that the method illustrated by flowchart 200 in FIG. 2 is not limited to the semiconductor devices shown in FIGS. 3 and 4. Also, certain details and features have been left out of flowchart 200 that are apparent to a person of ordinary skill in the art. For example, a step may comprise one or more substeps or may involve specialized equipment or materials, as known in the art. It is noted that the processing steps shown in flowchart 200 are performed on a portion of wafer, which, prior to step 210, includes, a semiconductor substrate, for example, an N type semiconductor substrate.

While steps 210 through 250 indicated in flowchart 200 are sufficient to describe embodiments of the present invention, other embodiments of the invention may utilize steps different from those shown in flowchart 200, or may comprise more, or fewer, steps. For example, while the method of flowchart 200 is for an N channel device, it will be appreciated that the present invention can also provide for a P channel device. Furthermore, the sequence of steps 210 through 250 is not limited by flowchart 200. For example, while flowchart 200 shows step 250 occurring after step 240, in other embodiments step 250 can occur before step 240.

Exemplary shallow and narrow trench FETs, which can be fabricated according the present invention, will be described with respect to FIGS. 3 and 4. Thus, FIG. 3 shows a cross-sectional view of exemplary shallow and narrow trench field-effect transistors (trench FETs), which can be fabricated according to one embodiment of the present invention. For example, FIG. 3 shows exemplary trench FETs 302a and 302b, which correspond to one another, include similar elements and dimensions, are generally identical, and may comprise multiple fingers or segments of the same transistor. Similarly, FIG. 4 shows a cross-sectional view of exemplary shallow and narrow trench field-effect transistors (trench FETs), which can be fabricated according to one embodiment of the present invention.

FIG. 3 includes semiconductor device 300, which can correspond to semiconductor device 400 in FIG. 4. Thus, semiconductor device 300 comprises similar elements as semiconductor device 400. For example, semiconductor device 300 includes trench FETs 302a and 302b, drift region 304, channel regions 306, source regions 308, trench 310, trench bottom 314, and channel length 320, which can correspond to trench FETs 402a and 402b, drift region 404, channel regions 406, source regions 408, trench 410, trench bottom 414, and channel length 420 respectively in FIG. 4. It is noted that other elements in FIG. 4, not marked for reference, can likewise correspond to similar elements in FIG. 3. Semiconductor device 400 in FIG. 4 notably includes bottom implanted region 430, which is not included in semiconductor device 300 in FIG. 3. Although steps 210, 230, 240, and 250 will be described with respect to semiconductor device 300, it will be appreciated that the steps can similarly be performed with respect to semiconductor device 400. For example, elements in semiconductor device 400 can be formed similar to corresponding elements in semiconductor device 300.

Referring now to step 210 of FIG. 2 and FIG. 3, step 210 of flowchart 200 comprises forming a trench within an N type semiconductor substrate, the trench including sidewalls and a bottom portion. For example, in step 210, trench 310 can be formed in a semiconductor substrate (not shown in FIG. 3). The semiconductor substrate can be, for example, an N type semiconductor substrate having the same dopant concentration as drift region 304, which is formed in the semiconductor substrate after step 210. In some embodiments the semiconductor substrate can be a support substrate. In other embodiments, the semiconductor substrate can be formed over a support substrate.

Trench 310, which can correspond to the trench formed in step 210, includes sidewalls 312 and bottom portion 314. As shown in FIG. 3, in contrast to sidewalls 112 in FIG. 1, sidewalls 312 taper into a narrow bottom portion 314. Thus, the uppermost width between sidewalls 312 can be, for example, approximately 0.3 microns and bottom trench width 322 can be, for example, approximately 0.19 microns. Upon completion of step 210, trench 310 does not include gate dielectric 316 and gate electrode 318. It is also noted that after step 210, source regions 308, and channel regions 306 are formed, for example, by doping the semiconductor substrate. The doped semiconductor substrate can be eventually etched to form etched regions 332, 334, and 336.

Now referring to step 220 of FIG. 2 and FIG. 4, step 220 of flowchart 200 comprises forming an N type bottom implanted region surrounding the bottom portion of the trench and having a dopant concentration greater than that of the semiconductor substrate. It is noted that step 220 is not required. As such, in other embodiments, flowchart 200 can transition from step 210 to step 230 without performing step 220. For example, FIG. 3 shows exemplarily trench FETs 302a and 302b formed without performing step 220. Conversely, FIG. 4 shows trench FETs 402a and 402b formed after performing step 220.

As shown in FIG. 4, semiconductor device 400 includes bottom implanted region 430, which can correspond to the N type bottom implanted region formed in step 220. As such, bottom implanted region 430 can surround the bottom portion of trench 410 and has a dopant concentration greater than that of the semiconductor substrate (not shown in FIG. 4). Thus, the dopant concentration of bottom implanted region 430 can also be greater than that of drift region 404 in FIG. 4. In the present example, bottom portion 414 of trench 410 is formed in bottom implanted region 430, which itself is formed in drift region 404. However, in the example shown in FIG. 3, bottom portion 314 of trench 310 is formed in drift region 304.

In semiconductor device 400, bottom implanted region 430 can account for process variations, which can form a shallower trench 410 than desired. For example, without bottom implanted region 430, bottom portion 414 may be formed too shallow to sufficiently contact drift region 404. Thus, bottom implanted region 430 can enable a shallower trench 410 by maintaining contact between bottom portion 414 and drift region 404 with process variations.

Furthermore, because trench FET 402a includes gate dielectric 416, formed without a thick bottom oxide, bottom implanted region 430 is not exposed to additional process temperatures used to form the thick bottom oxide. These additional process temperatures can prevent formation of an effective and controllable bottom implanted region, for example, in semiconductor device 100, by significantly driving deeper the dopants used to form the bottom implanted region. Controlling dopants is increasingly important as device dimensions are reduced, for example, in forming shallow and narrow trench FETs 402a and 402b.

Referring to step 230 of FIG. 2 and FIG. 3, step 230 of flowchart 200 comprises forming a substantially uniform gate dielectric in the trench. As noted above, in one embodiment step 230 can be performed after step 210 while skipping step 220, for example, resulting in semiconductor device 300 of FIG. 3. In another embodiment step 230 can be performed after step 220, for example, resulting in semiconductor device 400 of FIG. 4. Thus, the substantially uniform gate dielectric formed in step 230 can correspond to gate dielectric 316 in FIG. 3 and gate dielectric 416 in FIG. 4. Gate dielectric 316 can comprise, for example, thermally grown silicon oxide (SiO2), and in the present example is formed in trench 310 lining sidewalls 312 and bottom portion 314 of trench 310. In contrast to transistor 102a in FIG. 1, the thickness of the portion of gate dielectric 316 lining bottom portion 314 of trench 310 can be substantially equal to the portions of gate dielectric 316 lining respective sidewalls 212 of trench 310.

Gate dielectric 316 can be formed without a thick bottom oxide in trench 310. As discussed above, including gate dielectric 116 having thick bottom oxide 140 can reduce gate to drain charge $Q_{gd}$. However, also discussed above, forming thick bottom oxide 140 can introduce significant constraints in device fabrication, particularly in fabricating shallow and narrow trench FETs. Thus, in semiconductor device 300, sidewalls 312 of trench 310 taper into a narrower bottom portion 314. Alternatively, the entire trench 310 can be formed narrowly (with substantially the same small width) from top to bottom or with a slightly tapered bottom portion. However, including a narrower bottom portion 314 in forming trench FET 302a, according to the present invention, can substantially reduce gate to drain charge $Q_{gd}$ and overall gate charge $Q_g$, thereby significantly enhancing device performance. Thus, trench FETs 302a and 402a, for example, can be formed without a thick bottom oxide in respective trenches 310 and 410, while achieving low gate to drain charge $Q_{gd}$.

Referring now to step 240 of FIG. 2 and FIG. 3, step 240 of flowchart 200 comprises forming a gate electrode within the trench and over the gate dielectric. The gate electrode can correspond to gate electrode 318 of trench FET 302a in FIG. 3 and can comprise, for example, conductive polysilicon. The gate electrode can be made coplanar with a top surface of the semiconductor substrate. Thus, in the present example, gate electrode 318 is shown in FIG. 3 including planar surface 317, which is coplanar with a top surface of source regions 308. Gate electrode 318 can be made coplanar, for example, by depositing polysilicon over the semiconductor substrate and performing a chemical mechanical polishing.

Forming gate electrode 318 coplanar with a top surface of the semiconductor substrate can prevent short circuit between gate electrode 318 and source regions 308 in trench FET 302a. Thus, as shown in FIG. 3, gate electrode 318 can be formed without a recess, such as recess 117 in FIG. 1. In the present example, by forming gate electrode 318 without a recess, source depth 319 can be reduced without the risk of gate electrode 318 falling below source regions 308. Thus, channel length 320 and the depth of trench 310 can be further reduced.

Referring to step 250 of FIG. 2 and FIG. 3, step 250 of flowchart 200 comprises doping the semiconductor substrate to form a P type channel region. The P type channel region can correspond, for example, to any of channel regions 306 in semiconductor device 300. The channel region is thus formed over drift region 304. Furthermore, in the embodiment shown, the semiconductor substrate can be doped, for example, using dopant implantation, to form an N type source region, which can correspond, for example, to any of source regions 308 in FIG. 3. As shown in the present example, respective source regions 308 and respective channel regions 306 are adjacent trench 310. Also shown in FIG. 3, in semiconductor device 300, channel regions 306 are formed over drift region 304, and source regions 308 are formed over channel regions 306.

In contrast to conventional methods, in forming, for example, source regions 308 and channel regions 306, the doped semiconductor regions are exposed to significantly lower temperatures and are saved from higher temperature processes that were associated with trench formation and the related dielectric growth and deposition in the conventional process flow. Thus, the present invention prevents an increase in the depth of source regions 308 and channel regions 306 that would otherwise result from higher temperature processes in the conventional approach. Thus, the present invention provides for reduced source depth 319 and channel length 320, enabling a shorter channel length 320 and a shallower trench 310 in semiconductor device 300.

For example, in one embodiment, the semiconductor substrate is doped to form channel regions 306 after forming gate dielectric 316. Thus, the doped semiconductor substrate may not be exposed to, for example, high thermal oxidation temperatures. As stated previously, in one embodiment step 250 can be performed after step 230, but before step 240, of flowchart 200. However, in the embodiment shown in FIG. 2, the semiconductor substrate is doped to form channel regions 306 after forming gate dielectric 316 and gate electrode 318, i.e. step 250 is performed after both steps 230 and 240. In this way, the doped semiconductor substrate may not be exposed to, additional significant process temperatures for forming gate electrode 318.

Thus, in one specific example, in trench FET 302a, source depth 319 can be, for example, 0.15 microns and channel length 320 can be, for example, approximately 0.3 to 0.45 microns. By way of example, the depth of trench 310 can be approximately 0.6 to 0.8 microns. As such, ON-resistance $R_{dson}$ can be significantly reduced compared to, for example, transistor 102a in FIG. 1.

After completion of step 250, additional steps can be performed in order to form semiconductor device 300 in FIG. 3 or semiconductor device 400 in FIG. 4. For example, additional layers can be formed over the semiconductor substrate. Furthermore, in some embodiments, dielectric portions 324, 326, and 328 can be formed over source regions 308 and trench 310 by performing an etching step to form etched regions 332, 334, and 336. Dielectric materials 324, 326, and 328 can comprise, for example, $SiO_2$, and can insulate gate electrode 318 from source contact material 327.

Thus, as discussed above, in the embodiments of FIGS. 2, 3, and 4, the invention provides a method for fabricating semiconductor devices including a shallow and narrow trench FET and related structures. From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from is the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A trench field-effect transistor (trench FET) utilizing a trench situated within a semiconductor substrate of a first conductivity type,
   said trench including first and second sidewalls and a bottom, an entirety of said first and second sidewalls tapering into a bottom portion which includes said bottom, wherein a bottom trench width measured from said first sidewall to said second sidewall across said bottom of said trench is less than or approximately equal to two-thirds (⅔) of an uppermost width between said first and second sidewalls, thereby substantially reducing gate to drain charge of said trench FET,
   said bottom portion being surrounded by a bottom implanted region in a drift region, said bottom implanted region having a higher dopant concentration than said substrate,
   said trench FET further comprising a substantially uniform gate dielectric formed in said trench, a gate electrode formed within said trench and over said gate dielectric, and said semiconductor substrate is doped to form a channel region of a second conductivity type,
   a source region of said first conductivity type in said semiconductor substrate adjacent said trench,
   wherein said source region has a depth of less than approximately 0.15 microns, and wherein a channel length of said trench FET is less than or approximately equal to 0.3 microns,
   wherein said substantially uniform gate dielectric, said gate electrode and said semiconductor substrate have a coplanar top surface,
   wherein a top surface of said source region is completely covered by a dielectric material separate from said gate dielectric.

2. The trench FET of claim 1 wherein said semiconductor substrate is doped by dopant implantation.

3. The trench FET of claim 1, wherein said gate dielectric has a bottom thickness substantially equal to a sidewall thickness.

4. The trench FET of claim 1, wherein said gate electrode comprises polysilicon.

5. The trench FET of claim 1, wherein said bottom trench width is less than approximately 0.3 microns.

* * * * *